US006830977B1

(12) United States Patent
Jono et al.

(10) Patent No.: US 6,830,977 B1
(45) Date of Patent: Dec. 14, 2004

(54) METHODS OF FORMING AN ISOLATION TRENCH IN A SEMICONDUCTOR, METHODS OF FORMING AN ISOLATION TRENCH IN A SURFACE OF A SILICON WAFER, METHODS OF FORMING AN ISOLATION TRENCH-ISOLATED TRANSISTOR, TRENCH-ISOLATED TRANSISTOR, TRENCH ISOLATION STRUCTURES FORMED IN A SEMICONDUCTOR, MEMORY CELLS AND DRAMS

(75) Inventors: Keiji Jono, Hyogo (JP); Hirokazu Ueda, Hyogo (JP); Hiroyuki Watanabe, Hyogo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,550

(22) Filed: Aug. 31, 2000

(51) Int. Cl.[7] ............................................. H01L 21/336
(52) U.S. Cl. ....................... 438/296; 438/207; 438/218; 438/219; 438/294; 438/353; 438/361; 438/362
(58) Field of Search ................................. 257/506, 507, 257/508, 509, 510; 438/207, 218, 208, 219, 221, 297, 225, 348, 294, 353, 296, 356, 361, 424, 362, 425, 427, 439, 452, 647, 318, 404

(56) References Cited

U.S. PATENT DOCUMENTS

| 5,801,083 | A | * | 9/1998 | Yu et al. ...................... 438/424 |
| 5,874,317 | A | * | 2/1999 | Stolmeijer .................. 438/296 |
| 5,915,191 | A | | 6/1999 | Jun ............................. 438/431 |
| 5,969,393 | A | * | 10/1999 | Noguchi ..................... 257/396 |
| 5,994,198 | A | | 11/1999 | Hsu et al. |
| 6,034,409 | A | | 3/2000 | Sakai et al. |
| 6,081,662 | A | | 6/2000 | Murakami et al. |
| 6,087,705 | A | | 7/2000 | Gardner et al. ............. 257/510 |
| 6,154,417 | A | | 11/2000 | Kim |
| 6,171,924 | B1 | | 1/2001 | Wang et al. |
| 6,258,688 | B1 | * | 7/2001 | Tsai ............................. 438/381 |
| 6,274,457 | B1 | * | 8/2001 | Sakai et al. ................. 438/424 |
| 6,342,428 | B1 | * | 1/2002 | Zheng et al. ............... 438/424 |
| 6,350,655 | B2 | * | 2/2002 | Mizuo ........................ 438/424 |
| 6,355,540 | B2 | | 3/2002 | Wu ............................. 438/433 |
| 6,380,095 | B1 | * | 4/2002 | Liu et al. .................... 438/719 |
| 6,383,931 | B1 | * | 5/2002 | Flanner et al. ............. 438/689 |

FOREIGN PATENT DOCUMENTS

JP        01-282815      * 11/1989    ................. 27/10

OTHER PUBLICATIONS

*Shallow Trench Isolation Characteristics with High–Density–Plasma Chemical Vapor Deposition Gap–Fill Oxide for Deep–Submicron CMOS Technologies,* Seung–Ho Lee et al., Jpn. J. Appl. Phys. vol. 37 (1998), pp. 1222–1227.
*Impact of Shallow Trench Isolation on Reliability of Buried– and Surface–Chanel sub–μm PFET,* William Tonti et al., 1995 IEEE, pp. 24–29.
*Subbreakdown Drain Leakage Current in MOSFET,* J. Chen et al., 1987 IEEE, pp. 515–517.
*Shallow Trench Isolation for advanced ULSI CMOS Technologies,* M. Nandakumar et al, Siliocn Technology Development, Kilby Center, Texas Instruments, Undated, 4 pages.

* cited by examiner

Primary Examiner—Donghee Kang
Assistant Examiner—Quang Vu
(74) Attorney, Agent, or Firm—Wells St. John P.S.

(57) ABSTRACT

A method of forming an isolation trench in a semiconductor includes forming a first isolation trench portion having a first depth and having a first sidewall intersecting a surface of the semiconductor at a first angle. The method also includes forming a second isolation trench portion within and extending below the first isolation trench portion. The second isolation trench portion has a second depth and includes a second sidewall. The second sidewall intersects the first sidewall at an angle with respect to the surface that is greater than the first angle. A dielectric material fills the first and second isolation trench portions.

17 Claims, 3 Drawing Sheets

METHODS OF FORMING AN ISOLATION TRENCH IN A SEMICONDUCTOR, METHODS OF FORMING AN ISOLATION TRENCH IN A SURFACE OF A SILICON WAFER, METHODS OF FORMING AN ISOLATION TRENCH-ISOLATED TRANSISTOR, TRENCH-ISOLATED TRANSISTOR, TRENCH ISOLATION STRUCTURES FORMED IN A SEMICONDUCTOR, MEMORY CELLS AND DRAMS

TECHNICAL FIELD

The present invention relates to methods of forming an isolation trench in a semiconductor, methods of forming an isolation trench in a surface of a silicon wafer, methods of forming an isolation trench-isolated transistor, trench-isolated transistor, trench isolation structures formed in a semiconductor, memory cells and DRAMs.

BACKGROUND OF THE INVENTION

Field-effect transistors ("FETs") are used in memory structures such as dynamic random access memories ("DRAMs") for controlling access to capacitors used to store charge representing information contained in the memories. In DRAMs, charge leakage effects necessitate periodic refreshing of the information stored in the memory. In turn, refreshing of the DRAM leads to increased power consumption and delays in memory operation. Accordingly, it is desirable to reduce charge leakage effects in DRAMs.

Additionally, it is desirable to minimize the area required for fabrication of the elements of memories such as DRAMs. Electrical isolation of various circuit elements from each other is required. In turn, electrical isolation requires some of the space used on the DRAM or other integrated circuitry. Various techniques have been developed to reduce the amount of area needed for electrical isolation structures. One technique for providing a high degree of electrical isolation while requiring relatively little space is known as shallow trench isolation.

One source of charge leakage in DRAMs is related to carrier generation-recombination phenomena. In general, lower dopant concentrations tend to reduce this source of charge leakage. However, other concerns tend to determine lower bounds for dopant concentrations.

The FETs used as access transistors determine some of these other concerns. The FETs need to be able to provide a high impedance when they are turned OFF, and a low impedance connection when they are turned ON. DRAMs and other memories use an addressing scheme whereby a wordline that is coupled to many transistor gates is selected, and at the same time a bitline or digitline that is coupled to many transistor drains is also selected. A FET that is located at the intersection of the selected wordline and the selected bitline is turned ON, and that memory cell is accessed. At the same time, many other FETs have a drain voltage due to the drains of these FETs being coupled to the selected bitline. These FETs exhibit some parasitic conductance as a result of the drain voltage. In some types of integrated circuits, a portion of that parasitic conductance is due to corner effects that are an artifact of using trench isolation techniques to isolate the FETs from one another and from other circuit elements.

These effects are described in "Subbreakdown Drain Leakage Current in MOSFET" by J. Chen et al., IEEE El. Dev. Lett., Vol. EDL-8, No. 11, November 1987; "Impact Of Shallow Trench Isolation On Reliability Of Buried- And Surface-Channel Sub-$\mu$m PFET" by W. Tonti and R. Bolam, IEEE Cat. No. 0-7803-2031, 1995; "Shallow Trench Isolation For Advanced ULSI CMOS Technologies", M. Nandakumar et al.; and "Shallow Trench Isolation Characteristics With High-Density-Plasma Chemical Vapor Deposition Gap-Fill Oxide For Deep-Submicron CMOS Technologies", S.-H. Lee et al., Jpn. J. Appl. Phys., Vol. 37, 1998, pp. 1222–1227, which publications are hereby incorporated herein by reference for their general background teachings.

One method of reducing these parasitic conduction effects is to round the corner where the isolation trench meets the surface of the semiconductor material. This may be effected by oxidizing the surface of the silicon, as is described in the above-noted publications. However, this approach requires additional processing steps, which tend to result in reduced yield, among other things.

What is needed is a way to incorporate trench isolation together with FETs that does not increase processing complexity and that provides compact, low-leakage transistors in DRAMs and other circuitry.

SUMMARY OF THE INVENTION

In one aspect, the present invention provides a method of forming an isolation trench in a semiconductor. The method includes forming a first isolation trench portion having a first depth and having a first sidewall intersecting a surface of the semiconductor at a first angle. The method also includes forming a second isolation trench portion within and extending below the first isolation trench portion. The second isolation trench portion has a second depth and includes a second sidewall. The second sidewall intersects the first sidewall at an angle with respect to the surface that is greater than the first angle. A dielectric material fills the first and second isolation trench portions.

In another aspect, the present invention includes a method of forming an isolation trench in a surface of a silicon wafer. The method includes forming a mask on the surface, where the mask includes an opening and sidewalls, and etching the silicon surface using gases including $CF_4$ and $CHF_3$ in a ratio of $CF_4/CHF_3=0.11$ to 0.67 to form a first isolation trench portion.

In a further aspect, the present invention includes a trench-isolated transistor. The trench-isolated transistor includes first and second isolation trenches each disposed on a respective side of a portion of silicon. The first and second isolation trenches each include a first isolation trench portion having a first depth and having a first sidewall intersecting a surface of the silicon at a first angle. The first and second isolation trenches each also include a second isolation trench portion within and extending below the first isolation trench portion. The second isolation trench portion has a second depth and includes a second sidewall intersecting the first sidewall at an angle with respect to the surface that is greater than the first angle. The first and second isolation trenches are filled with a dielectric material. The transistor further includes a gate extending across the silicon portion from the first isolation trench to the second isolation trench, and source and drain regions extending between the first and second isolation trench portions and across the silicon portion. The source region is adjacent one side of the gate and the drain region is adjacent another side of the gate that is opposed to the one side.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the Progress of Science and useful Arts" (Article 1, Section 8).

Figure 1:
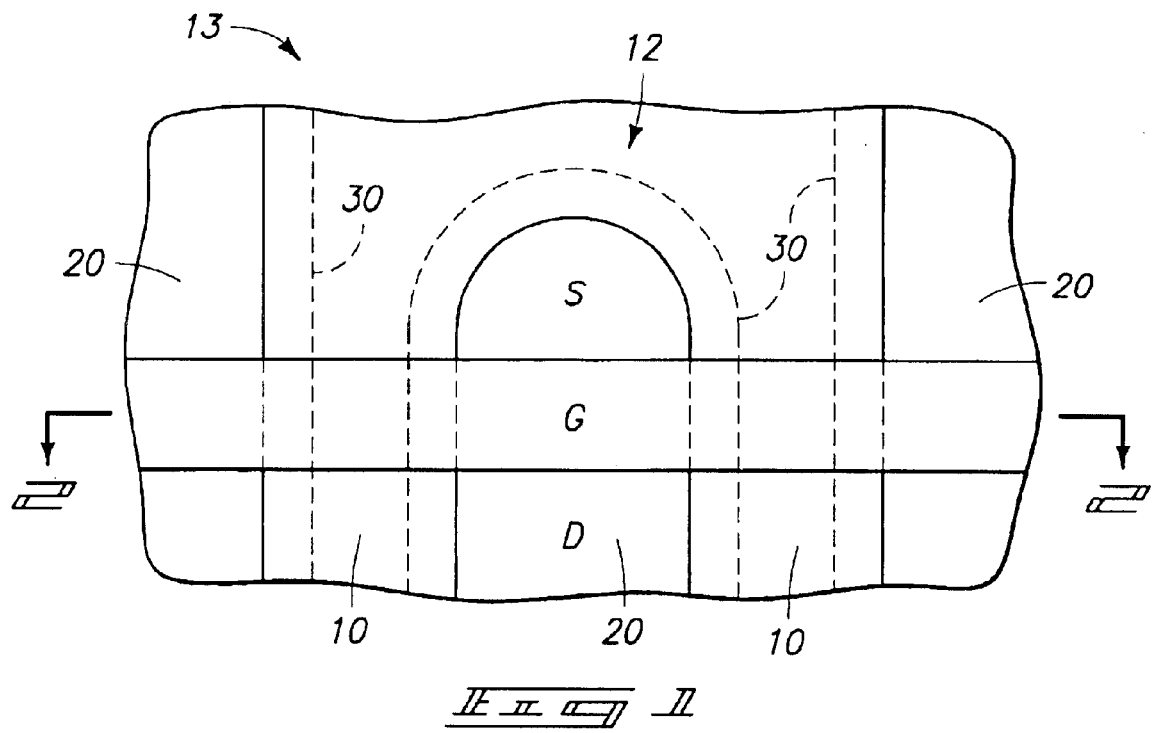
FIG. 1 is a simplified plan view of shallow trench isolation structures and a FET, in accordance with an embodiment of the present invention.

FIG. 1 shows trench isolation structures 10 and a FET 12 formed in a semiconductor substrate 13, in accordance with but one preferred embodiment of the present invention. The FET 12 includes a gate G, which may be formed from polysilicon, a source S and a drain D. The trench isolation structures 10 each include a first isolation trench portion 14 having a first depth 16 and having first sidewalls 18 each intersecting a surface 20 of the semiconductor substrate 13 at a first angle $\theta_1$.

The trench isolation structures 10 also each include a second isolation trench portion 24 within and extending below the first isolation trench portion 14. The second isolation trench portions 24 have a second depth 26 and include second sidewalls 28 each intersecting one of the first sidewalls 18 at a second angle $\theta_2$ with respect to the surface 20 that is greater than the first angle $\theta_1$ to form shoulders 30 at the juncture of the first sidewall 18 and the second sidewall 28.

In one embodiment, the shoulders 30 result in substantial reduction f subthreshold current through the FET 12. In other words, when the FET 12 is OFF, the amount of current that can be induced in the FET 12 by applying voltage to the drain D is greatly reduced.

In one embodiment, the first angle $\theta_1$ is less than about sixty degrees and second angle $\theta_2$ is eighty degrees or more. In one embodiment, the first angle $\theta_1$ is in a range of from about five degrees to about forty-five degrees. In one embodiment, the first angle $\theta_1$ is about thirty-five degrees. In one embodiment, the first angle $\theta_1$ is about forty degrees. The concerns addressed in selecting the first angle $\theta_1$ are to select an angle $\theta_1$ providing a shoulder that reduces electrical fields in the subsequently-formed FET 12 and to also select an angle that does not impede subsequent filling of the trench isolation structures 10 with dielectric material such as silicon dioxide.

Further in the illustrated embodiments, substantially straight linear segment 18 extends entirely between and to outermost surface portion 20, respectively, and to segment 28. Substantially straight linear segment 28 extends from segment 18 to a bottom of the trench isolation structure 10.

Alternate embodiments are, of course, contemplated whereby some substantially straight linear segment occurs somewhere within each of first sidewalls 18 and second sidewalls 28, without extending over the entirety of the first 18 and second 28 sidewalls. In the context of this patent, "substantially straight linear" means a perfectly straight segment as well as a segment that has a degree of curvature associated with it. A curved segment is to be considered "substantially straight linear" in the context of this patent provided that it has some chord length greater than or equal to 30 nanometers and has some radius of curvature of at least 20 nanometers.

The first sidewall 18 needs to incorporate a lateral dimension wide enough such that wet dips occurring during processing steps such as nitride hard mask removal and those subsequent up to gate oxide growth do not start to etch down the sidewall of the isolation trench structure 10. That dimension is proportional to the various dielectric layer thicknesses, and so can vary greatly from process to process and through different technology generations. Exemplary minimum extents for the first sidewalls 18, i.e., distance from the top surface 20 to the shoulder 30, are in a range of from 50 Angstroms to 500 Angstroms.

Figure 3:
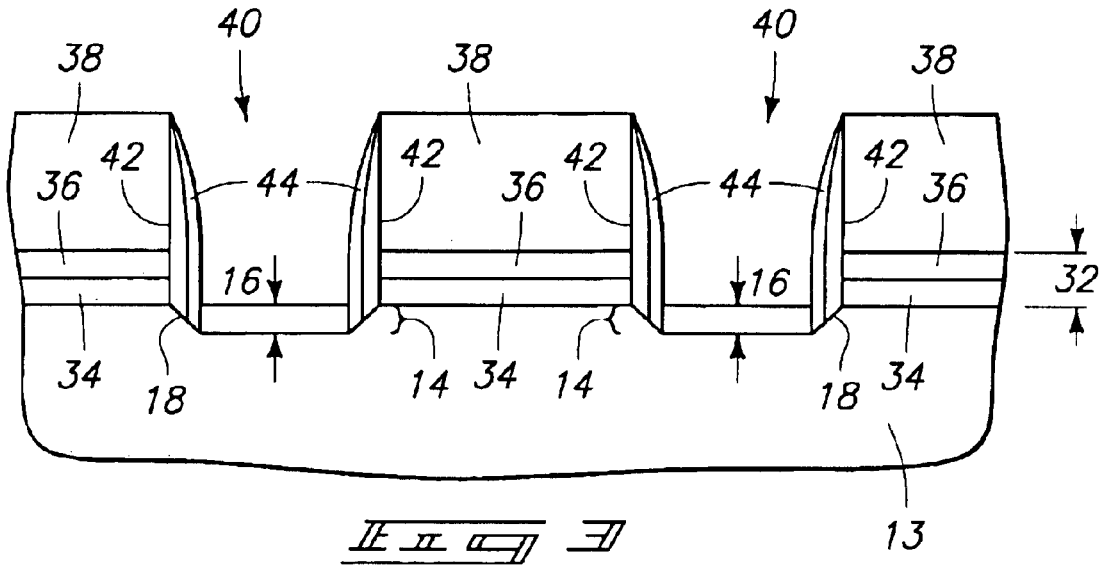
FIG. 3 is a simplified side view, in section, illustrating formation of a trench isolation structure, in accordance with an embodiment of the present invention.

FIG. 3 is a simplified side view, in section, illustrating formation of a trench isolation structure, in accordance with an embodiment of the present invention. In one embodiment, the trench isolation structures 10 are created by forming a masking layer 32 on the semiconductor surface 20. In one embodiment, the masking layer 32 includes a silicon dioxide layer 34 having a thickness of about 100 Angstroms and a silicon nitride layer 36 having a thickness of about 1000 Angstroms. A photoresist layer 38 is formed on the masking layer 32, and openings 40 corresponding to the trench isolation structures 10 are formed in the photoresist. The openings 40 have sidewalls 42.

In one embodiment, a plasma etch is used to form openings in the masking layer 32. The plasma etch is also used to etch the first isolation trench portions 14. In one embodiment, the plasma etch is performed using a mixture of fluorocarbon and fluorohydrocarbon gases, such as, by way of example, $CF_4$, $CHF_3$, $CH_2F_2$ and/or $C_2F_8$ or the like. In one embodiment, the plasma etch is performed using a mixture of $CF_4$ and $CHF_3$ in a ratio ranging from 0.11 to 0.67.

In one embodiment, the masking layer 32 is etched, and then etching is continued for a predetermined time to etch the first isolation trench portion 14. In one embodiment, the etching is carried out for 30 seconds, where the first half of the etching process is used to broach the masking layer 32. In one embodiment, the etching is carried out for 40 seconds. A broad variety of implementations are possible, using different etch gas compositions, pressures and etch times, as may be seen by comparing these examples to the example below. In one embodiment, etching is carried out using parameters given below in Table I in a Hitachi microwave etcher model 511A, using the photoresist 38, silicon nitride 36 and silicon dioxide 34 mask structure 32 described above.

TABLE I

EXEMPLARY SHOULDER FORMATION PROCESSING PARAMETERS

| Parameter | Units | Mask etch | Overetch | Trench | De-chuck |
|---|---|---|---|---|---|
| Step time | seconds | 60 | 22 | 78 | 1.0 |
| Gas 1 | sccm | 200 | 200 | 0 | 150 |
| Gas 2 | sccm | 160 | 60 | 0 | 0 |
| Gas 3 | sccm | 40 | 140 | 0 | 0 |
| Gas 4 | sccm | 0 | 0 | 100 | 0 |
| Gas 5 | sccm | 0 | 0 | 5.7 | 0 |
| Pressure | mTorr | 20 | 20 | 6 | 7.5 |
| Power 1 | W | 550 | 550 | 800 | 1000 |
| Power 2 | W | 90 | 130 | 60 | 0 |

Notes: gas 1 corresponds to argon, gas 2 corresponds to $CF_4$, gas 3 corresponds to $CHF_3$, gas 4 corresponds to HBr, gas 5 corresponds to $O_2$, power 1 corresponds to magnetron power and power 2 corresponds to applied RF power.

The shoulder 30 is formed by a process whereby a polymer 44 is formed on the sidewalls 42. By adjusting the composition of the etching gases, applied RF power, chamber pressure and the like, the polymer 44 is formed at a rate that encourages a particular first angle $\theta_1$ to be formed during the etching process. By stopping the etching and polymer deposition at the end of the predetermined time interval, the first depth 16 can be controlled. The second isolation trench portion 24 is then etched, using a different etch gas mixture, for example, as noted in Table I.

In another embodiment, a first etch is carried out to provide the first isolation trench portion 14. A second masking step is then carried out, and openings corresponding to the second isolation trench portion 24 are created. The second isolation trench portion 24 is then etched.

In one embodiment, the first depth 16 is chosen to be five to thirty or fifty percent of the total trench depth, i.e., the first depth 16 plus the second depth 26. In one embodiment, the first depth 16 is chosen to be five to fifteen percent of the total trench depth. In one embodiment, bottoms of the trenches are implanted with dopant after the first 14 and second 24 trench portions are etched. This allows a shallower trench to be employed, and results in the first depth 16 being a larger percentage of the total trench depth.

In one embodiment, implant doses required to form the source S and drain D regions are reduced by as much as ten percent when the shoulder 30 is present, resulting in an increase of as much as thirty percent of the time required between refresh cycles. For example, if a typical implant dose of $5.4 \times 10^{12}/cm^2$ were ordinarily required to dope channel regions, a dose of $4.9 \times 10^{12}/cm^2$ could be employed together with formation of the shoulder 30.

Following etching of the first 14 and second 24 isolation trench portions, the photoresist layer 38 and the polymer 44 may be stripped using a conventional oxygen ashing process. A dielectric material, typically silicon dioxide, may be used to fill the first 14 and second 24 isolation trench portions, and conventional chemical-mechanical polishing may be used to planarize the resultant structure. In one embodiment, plasma etchback is employed to planarize the dielectric material, usually together with another patterning step or a planarizing coating layer. The gate G may be formed using conventional polysilicon, polycide or metal, and the source S and drain D may be formed using conventional ion implantation techniques or doping outdiffusion from subsequent layers.

Figure 2:
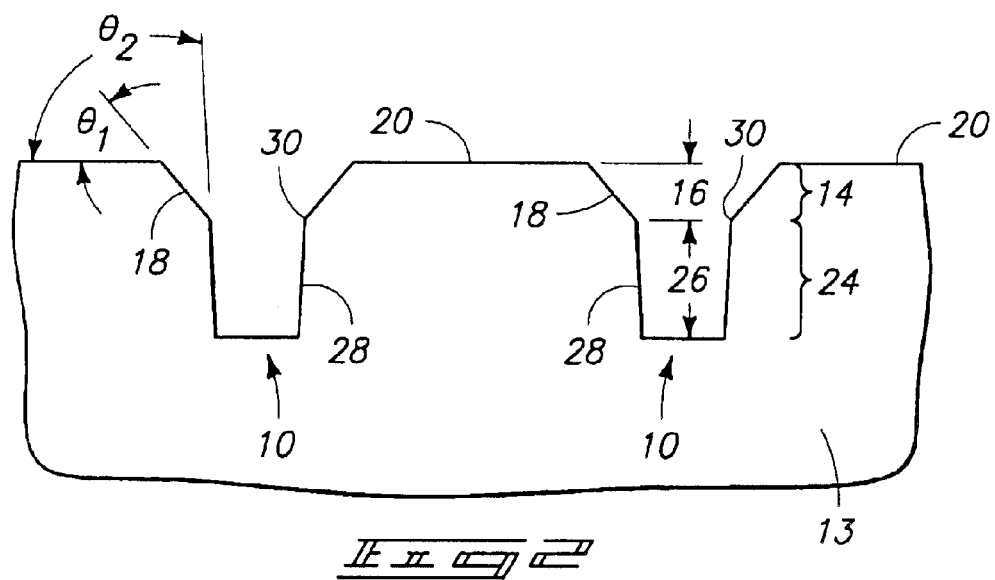
FIG. 2 is a simplified side view, in section, taken along section lines 2—2 of FIG. 1, of the shallow trench isolation structures and FET of FIG. 1, in accordance with an embodiment of the present invention.
Figure 4:
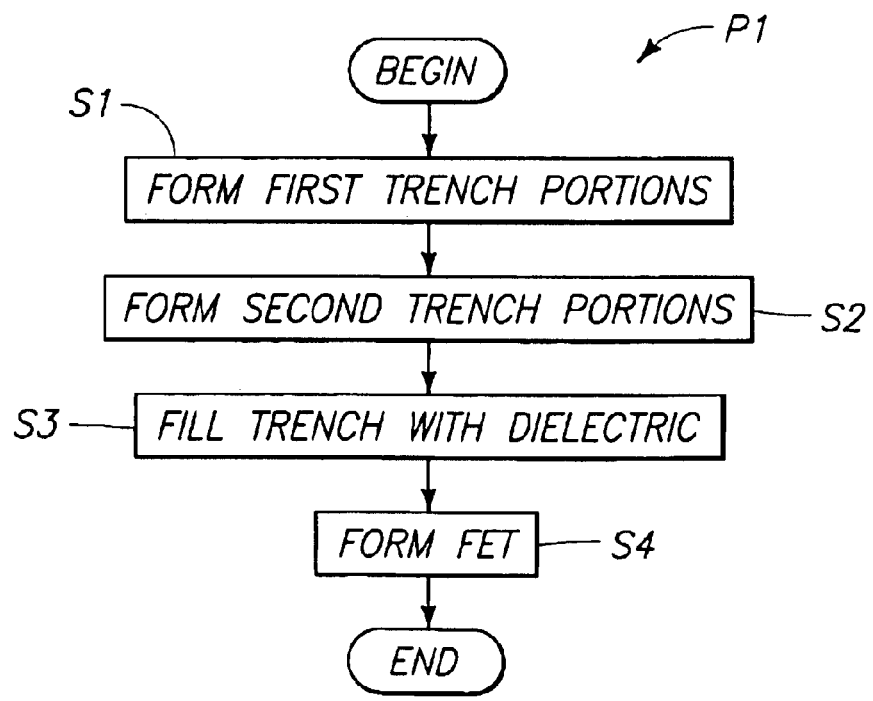
FIG. 4 is a simplified flow chart of a process for forming the structures of FIGS. 1 and 2, in accordance with an embodiment of the present invention.

FIG. 4 is a simplified flow chart of a process P1 for forming the structures of FIGS. 1 and 2, in accordance with an embodiment of the present invention.

In a step S1, the first isolation trench portions 14 are formed. In one embodiment, the first isolation trench portions 14 are formed by forming the masking layer 32, followed by plasma etching, as described above.

In a step S2, the second isolation trench portions 24 are formed. In one embodiment, the second isolation trench portions 24 are formed by etching as described above with reference to FIG. 3 and Table I. In one embodiment, the second isolation trench portions 24 are formed by separate masking and etching operations.

In a step S3, the first 14 and second 24 trench portions are filled with a dielectric using conventional processing techniques as described above. The step S3 may include planarization of the dielectric material, for example via conventional chemical-mechanical polishing.

In a step S4, the FET 12 is formed, using conventional processing techniques, as discussed above. The process P1 then ends, and processing continues using conventional processing operations.

Figure 5:
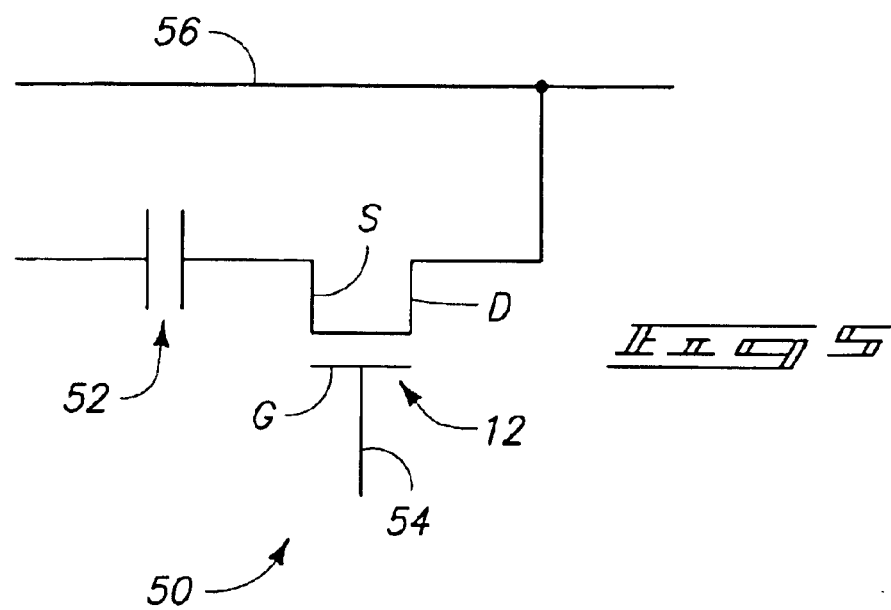
FIG. 5 is a simplified schematic diagram of a memory cell that advantageously employs the structures of FIGS. 1 and 2, in accordance with an embodiment of the present invention.

FIG. 5 is a simplified schematic diagram of a memory cell 50 that advantageously employs the structures of FIGS. 1 and 2, in accordance with an embodiment of the present invention. The memory cell 50 includes the FET 12 of FIGS. 1 and 2, a capacitor 52 coupled to the source S of the FET 12, a wordline 54 coupled to the gate G (and to other gates in other memory cells) and a bitline 56 coupled to the drain D of the FET 12 (and to other drains in other memory cells). By selecting the wordline 54 and the bitline 56, the FET 12 is turned ON, and charge stored in the capacitor 52 can then be measured to determine the datum stored in the memory cell 50. Alternatively, by selecting and turning the FET 12 ON, charge can be injected into the capacitor 52 to write a datum therein, and the FET 12 can then be turned OFF to store the datum in the memory cell 50.

Figure 6:
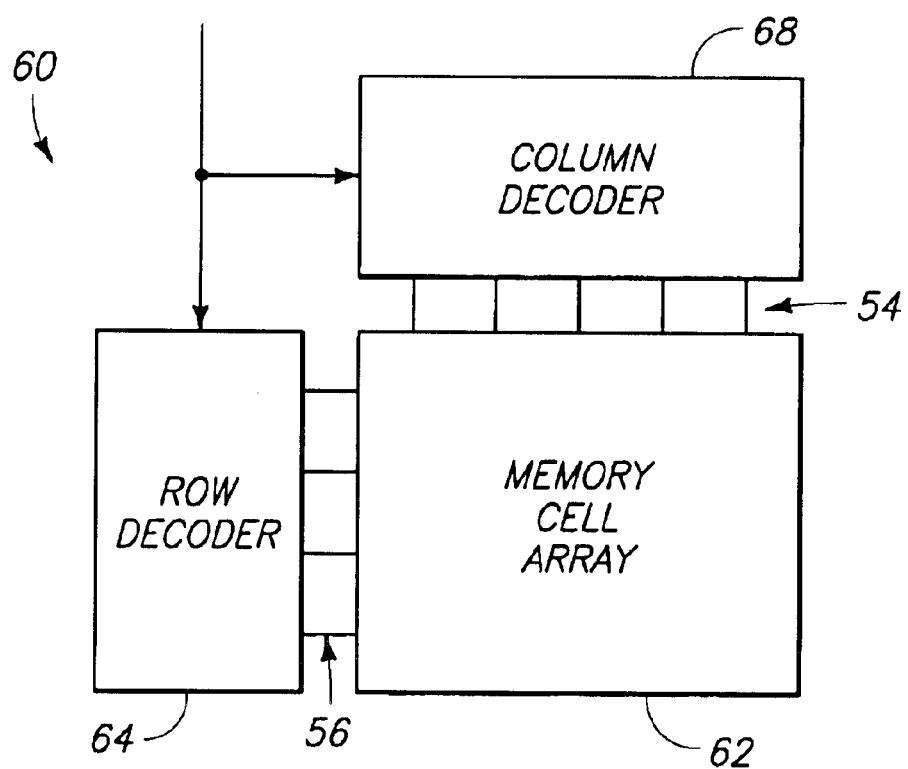
FIG. 6 is a simplified block diagram of a DRAM that advantageously employs the structures of FIGS. 1, 2 and 5, in accordance with an embodiment of the present invention.

FIG. 6 is a simplified block diagram of a DRAM 60 that advantageously employs the structures of FIGS. 1, 2 and 5, in accordance with an embodiment of the present invention. The DRAM 60 includes a memory cell array 62 coupled to a group of wordlines 56 and a group of bitlines 54. Address decoders, such as a row decoder 64 and a column decoder 68, decode addresses provided via a bus, allowing data to be read from or written to memory cells 50 in the memory cell array 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an isolation trench in a semiconductor substrate comprising:

forming a masking layer over a semiconductor substrate, the masking layer comprising silicon nitride received over an oxide layer;

etching through the masking layer within a microwave powered plasma etcher effective to expose semiconductive material of the semiconductor substrate using a first gas chemistry comprising $CF_4$ and $CHF_3$, a first magnetron power, and a first RF power; etching into semiconductive material of the semiconductor substrate within the microwave powered plasma etcher using a second gas chemistry comprising $CF_4$ and $CHF_3$, a second magnetron power, and a second RF power; quantity of $CF_4$ being greater than quantity of $CHF_3$ in the first gas chemistry, quantity of $CHF_3$ being greater than quantity of $CF_4$ in the second gas chemistry, the second RF power being greater than the first RF power, the etching of the masking layer and into semiconductive material forming a first isolation trench portion within semiconductive material of the semiconductor substrate, the first isolation trench portion having a first depth within the semiconductor substrate and having a first sidewall intersecting an upper surface of semiconductive material of the semiconductor substrate at a first angle;

forming a second isolation trench portion within semiconductive material of the semiconductor substrate, the second isolation trench portion being formed within and extending below the first isolation trench portion, the second isolation trench portion having a second depth within semiconductive material of the semiconductor substrate and including a second sidewall intersecting the first sidewall at an angle with respect to the upper surface that is greater than the first angle; and filling the first and second isolation trench portions with dielectric material.

2. The method of claim 1 further comprising:

terminating the forming of the second isolation trench portion; and then de-chucking the semiconductor substrate in an environment of argon.

3. The method of claim 1 wherein the forming of the second isolation trench portion occurs by etching in the microwave powered etcher using a gas chemistry which is void of $CF_4$ and $CHF_3$.

4. The method of claim 1 wherein the first and second magnetron powers are the same.

5. The method of claim 1 wherein the forming of the second isolation trench portion occurs by etching in the microwave powered etcher using a magnetron power which is greater than the first magnetron power.

6. The method of claim 1 wherein the forming of the second isolation trench portion occurs by etching in the microwave powered etcher using a magnetron power which is greater than the second magnetron power.

7. The method of claim 1 wherein the forming of the second isolation trench portion occurs by etching in the microwave powered etcher using a magnetron power which is greater than both the first and second magnetron powers.

8. The method of claim 7 wherein the first and second magnetron powers are the same.

9. The method of claim 1 wherein the forming of the second isolation trench portion occurs by etching in the microwave powered etcher, and further comprising dechucking the substrate in an inert atmosphere using a magnetron power which is greater than both the first and second magnetron powers.

10. The method of claim 1 wherein the dechucking the substrate is void of using RF power.

11. The method of claim 1 wherein the forming of the second isolation trench portion occurs by etching in the microwave powered etcher, pressure within the etcher during etching the second isolation trench portion being less than pressure within the etcher during etching of the masking layer and into semiconductive material to form the first isolation trench portion.

12. The method of claim 1 wherein the forming of the second isolation trench portion occurs by etching in the microwave powered etcher using a gas chemistry which is void of any inert gas.

13. The method of claim 1 wherein the semconductive material comprises silicon.

14. The method of claim 1 wherein the forming of the second isolation trench portion includes forming the second angle to be between eighty and ninety degrees.

15. The method of claim 1 wherein the forming of the first isolation trench portion includes forming the first angle to be in a range of from about thirty degrees to about seventy degrees and forming a second isolation trench portion includes forming the second angle to be more than eighty degrees.

16. The method of claim 1 further comprising planarizing the dielectric material filling the first and second isolation trench portions.

17. The method of claim 1 wherein the forming of said first isolation trench portion comprises forming a first isolation trench portion sidewall at least some of which forms a substantially straight linear segment.

* * * * *

UNITED STATES PATENT AND TRADEMARK OFFICE
CERTIFICATE OF CORRECTION

PATENT NO. : 6,830,977 B1
DATED : December 14, 2004
INVENTOR(S) : Jono et al.

It is certified that error appears in the above-identified patent and that said Letters Patent is hereby corrected as shown below:

Column 3,
Line 49, please delete "f" after "reduction" and insert -- of --.

Column 8,
Line 13, please delete "claim 1" after "method of" and insert -- claim 9 --.

Signed and Sealed this

Twelfth Day of July, 2005

JON W. DUDAS
*Director of the United States Patent and Trademark Office*